(12) United States Patent
Nobbe

(10) Patent No.: US 10,038,409 B2
(45) Date of Patent: Jul. 31, 2018

(54) RF SWITCH WITH INTEGRATED TUNING

(71) Applicant: pSemi Corporation, San Diego, CA (US)

(72) Inventor: Dan William Nobbe, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 14/195,701

(22) Filed: Mar. 3, 2014

(65) Prior Publication Data

US 2015/0249479 A1    Sep. 3, 2015

(51) Int. Cl.

| | |
|---|---|
| *H03F 1/30* | (2006.01) |
| *H04B 1/44* | (2006.01) |
| *H04B 17/12* | (2015.01) |
| *H04B 7/015* | (2006.01) |
| *H04B 7/02* | (2018.01) |
| *H04B 15/00* | (2006.01) |
| *H04B 1/18* | (2006.01) |
| *H03F 3/193* | (2006.01) |
| *H03F 3/21* | (2006.01) |
| *H04B 1/525* | (2015.01) |
| *H03F 3/195* | (2006.01) |

(Continued)

(52) U.S. Cl.
CPC ............... *H03F 1/301* (2013.01); *H03F 1/30* (2013.01); *H03F 3/193* (2013.01); *H03F 3/195* (2013.01); *H03F 3/21* (2013.01); *H03F 3/213* (2013.01); *H04B 1/18* (2013.01); *H04B 1/44* (2013.01); *H04B 1/525* (2013.01); *H04B 7/015* (2013.01); *H04B 7/02* (2013.01); *H04B 15/005* (2013.01); *H04B 17/12* (2015.01); *H04L 27/20* (2013.01); *H03F 3/04* (2013.01); *H03F 2200/18* (2013.01); *H03F 2200/451* (2013.01); *H03F 2200/456* (2013.01); *H03F 2200/471* (2013.01); *H03F 2200/555* (2013.01)

(58) Field of Classification Search
CPC ....................................................... H04L 27/20
See application file for complete search history.

(56) References Cited

U.S. PATENT DOCUMENTS 3,699,451 A * 10/1972 Ohaski ........................... 455/131
5,630,223 A *  5/1997 Bahu et al. ................... 455/296
(Continued)

FOREIGN PATENT DOCUMENTS

WO         2009108391         9/2009

OTHER PUBLICATIONS

Nobbe, et al., "Scalable Periphery Tunable Matching Power Amplifier", patent application filed Mar. 12, 2013 for related U.S. Appl. No. 13/797,779, 89 pgs.

(Continued)

*Primary Examiner* — Hsin-Chun Liao
(74) *Attorney, Agent, or Firm* — Jaquez Land Greenhaus LLP; Martin J. Jacquez, Esq.; Alessandro Steinfl, Esq.

(57) ABSTRACT

Methods and devices are described for reducing receiver complexity in an RF front-end stage. In one exemplary implementation, a switch is used to connect a plurality of receive paths to a single input amplifier of a transceiver unit used the RF front-end stage. In another exemplary implementation, the switch has a tunable network which can be tuned with respect to various frequencies of operation of the receive path and associated RF signal.

33 Claims, 9 Drawing Sheets

(51) Int. Cl.
*H03F 3/213* (2006.01)
*H04L 27/20* (2006.01)
*H03F 3/04* (2006.01)

(56) References Cited

U.S. PATENT DOCUMENTS

| | | | |
|---|---|---|---|
| 6,804,502 | B2 | 10/2004 | Burgener et al. |
| 7,248,120 | B2 | 7/2007 | Burgener et al. |
| 7,910,993 | B2 | 3/2011 | Brindle et al. |
| 2008/0122723 | A1* | 5/2008 | Rofougaran ............ 343/861 |
| 2013/0222075 | A1 | 8/2013 | Reedy et al. |

OTHER PUBLICATIONS

Gaynor, Michael, "Methods and Devices for Impedance Matching in Power Amplifier Circuits", patent application filed Sep. 30, 2013 for related U.S. Appl. No. 14/042,312, 40 pgs.

Nobbe, et al., "Systems and Methods for Optimizing Amplifier Operations", patent application filed Mar. 14, 2013 for related U.S. Appl. No. 13/828,121, 29 pgs.

Gaynor, Michael, "Tunable Impedance Matching Network", patent application filed Aug. 15, 2013 for related U.S. Appl. No. 13/967,866, 36 pgs.

Kaatz, et al., "Variable Impedance Match and Variable Harmonic Terminations for Different Modes and Frequency Bands", patent application filed Mar. 12, 2013 for related U.S. Appl. No. 13/797,686, 42 pgs.

Gaynor, Michael, "Methods and Devices for Thermal Control in Power Amplifier Circuits", patent application filed Sep. 30, 2013 for related U.S. Appl. No. 14/042,331, 38 pgs.

Nobbe, et al., "Amplifier Dymanic Bias Adjustment for Envelope Tracking", patent application filed Mar. 14, 2013 for related U.S. Appl. No. 13/829,946, 177 pgs.

Nobbe, et al., "Control Systems and Methods for Power Amplifiers Operating in Envelope Tracking Mode", patent application filed Mar. 14, 2013 for related U.S. Appl. No. 13/830,555, 169 pgs.

* cited by examiner

RF SWITCH WITH INTEGRATED TUNING

CROSS REFERENCE TO RELATED APPLICATIONS

The present application may be related to U.S. Pat. No 6,804,502, issued on Oct. 12, 2004 and entitled "Switch Circuit and Method of Switching Radio Frequency Signals", the disclosure of which is incorporated herein by reference in its entirety. The present application may also be related to U.S. Pat. No. 7,910,993, issued on Mar. 22, 2011 and entitled "Method and Apparatus for use in Improving Linearity of MOSFET's using an Accumulated Charge Sink", the disclosure of which is incorporated herein by reference in its entirety. The present application may also be related to U.S. patent application Ser. No. 13/797,779 entitled "Sealable Periphery Tunable Matching Power Amplifier", flied on Mar. 12, 2013, the disclosure of which is incorporated herein by reference in its entirety. The present application may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. The present application may also be related to U.S. patent application Ser. No. 13/595,893, entitled "Methods and Apparatuses for Use in Tuning Reactance in a Circuit Device", filed on Aug. 27, 2012, the disclosure of which is incorporated herein by reference in its entirety. The present application may also be related to U.S. patent application Ser. No. 14/042,312, filed on Sep. 30, 2013, entitled "Methods and Devices for Impedance Matching in Power Amplifier Circuits", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to U.S. patent application Ser. No. 13/828,121, filed on Mar. 14, 2013, entitled "Systems and Methods for Optimizing Amplifier Operations", the disclosure of which is incorporated herein by reference in its entirety. The present application may also he related to U.S. patent application Ser. No. 13/967,866 entitled "Tunable Impedance Matching Network", filed on Aug. 15, 2013, the disclosure of which is incorporated herein by reference in its entirety. The present application may also be related to U.S. patent application Ser. No. 13/797,686 entitled "Variable Impedance Match and Variable Harmonic Terminations for Different Modes and Frequency Bands", filed on Mar. 12, 2013, the disclosure of which is incorporated herein by reference in its entirety. The present application may also be related to U.S. patent application Ser. No. 14/042,331 entitled "Methods and Devices for Thermal Control in Power Amplifier Circuits", filed on Sep. 30, 2013, the disclosure of which is incorporated herein by reference in its entirety. The present application may also be related to U.S. patent application Ser. No. 13/829,946 entitled "Amplifier Dynamic Bias Adjustment for Envelope Tracking, filed on Mar. 14, 2013, the disclosure of which is incorporated herein by reference in its entirety. The present application may also be related to U.S. patent application Ser. No. 13/830,555 entitled "Control Systems and Methods for Power Amplifiers Operating in Envelope Tracking Mode", filed on Mar. 14, 2013, the disclosure of which is incorporated herein in its entirety.

BACKGROUND

1. Field

The present teachings relate to RF (radio frequency) circuits. More particularly, the present teachings relate to methods and apparatuses for reducing receiver interconnections in an RF front-end stage via usage of an RF switch with integrated tuning.

2. Description of Related Art

Radio frequency (RF) devices, such as cell phone transmitters, are becoming increasingly complex due to additional frequency bands, more complex modulation schemes, higher modulation bandwidths, and the introduction of efficiency improvement schemes such as envelope tracking. Standard transceiver integrated circuits (ICs) used in communication systems, such as cell phones, contain numerous input/output pins some of which are dedicated to receive/process signals/data received through, for example, an antenna. Such dedicated inputs are typically configured as differential inputs for optimal noise immunity and referred to as low noise amplifier (LNA) inputs. Furthermore, to achieve optimum performance in receiving the data (e.g. reception channel), the LNA input needs to be matched to the source impedance under consideration of the properties of the printed circuit board on which the transceiver IC is assembled, This matching is typically done via matching circuits (e.g. RLC networks) placed between the input source (e.g. signal) and the LNA input of the IC and designed to have a relatively narrow passband corresponding to a frequency band of interest (e.g., center frequency $f_0$ of the band). Taking into consideration for various communication frequency bands (e.g. using different center frequencies) different matching circuits feeding different LNA inputs may be needed. Such configuration can increase the number of components required in an RF device which in turn can increase the complexity of routing the various components as well as cost associated with the device. Furthermore, with the usage of diversity antennas with the aim to reduce fading effects on a detected signal by building into the RF device redundant receive paths tuned to receive signals from the diversity antennas, more design and manufacturing challenges can be expected.

SUMMARY

According to a first aspect of the present disclosure, a radio frequency (RF) circuital arrangement configured to receive an RF signal at an input RF receive port of the RF circuital arrangement is presented, the RF circuital arrangement comprising: an RF transceiver switch comprising a common terminal and a plurality of switching terminals, and an RF tuning circuit coupled to the common terminal of the RF transceiver switch via a first terminal of the RF tuning circuit, wherein, during operation of the RF circuital arrangement: the RF transceiver switch is configured to selectively couple an RF signal at a switching terminal of the plurality of switching terminals to the first terminal of the RF tuning circuit, and the RF tuning circuit is configured to tune a characteristic of the RF signal at the first terminal of the RF tuning circuit based on the selected switching terminal and provide a tuned version of the RF signal at a second port of the RF tuning circuit.

According to second aspect of the present disclosure, a radio frequency (RF) integrated circuit is presented, the RF integrated circuit comprising: an RF switch comprising a common terminal and a plurality of switch terminals; an RF tuning circuit comprising a first port and a second port, wherein the first port is connected to the common terminal of the RF switch; a plurality of input terminals connected to the plurality of switch terminals; an output terminal connected to the second port of the RF tuning circuit, and one or more control terminals, wherein during operation, a control signal at a terminal of the one or more control terminals of the RF integrated circuit is configured to tune the inning circuit and/or connect one terminal of the plurality of switch terminals to the common terminal of the RF switch.

According to third aspect of the present disclosure a method for reducing complexity of a radio frequency (RF) circuital arrangement is presented, the method comprising: providing an RF switch comprising a common terminal and a plurality of switching terminals; providing an RF tuning circuit: coupling a first terminal of the RF tuning circuit to the common terminal of the RF switch; selecting, via the RF switch, an RF signal at a first switching terminal of the plurality of switching terminals of the RF switch; based on the selecting, configuring the RF tuning, circuit for at first tuning of a plurality of different tunings, and based on the selecting and the configuring, obtaining a tuned RF signal at a second port of the RF tuning circuit.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1:
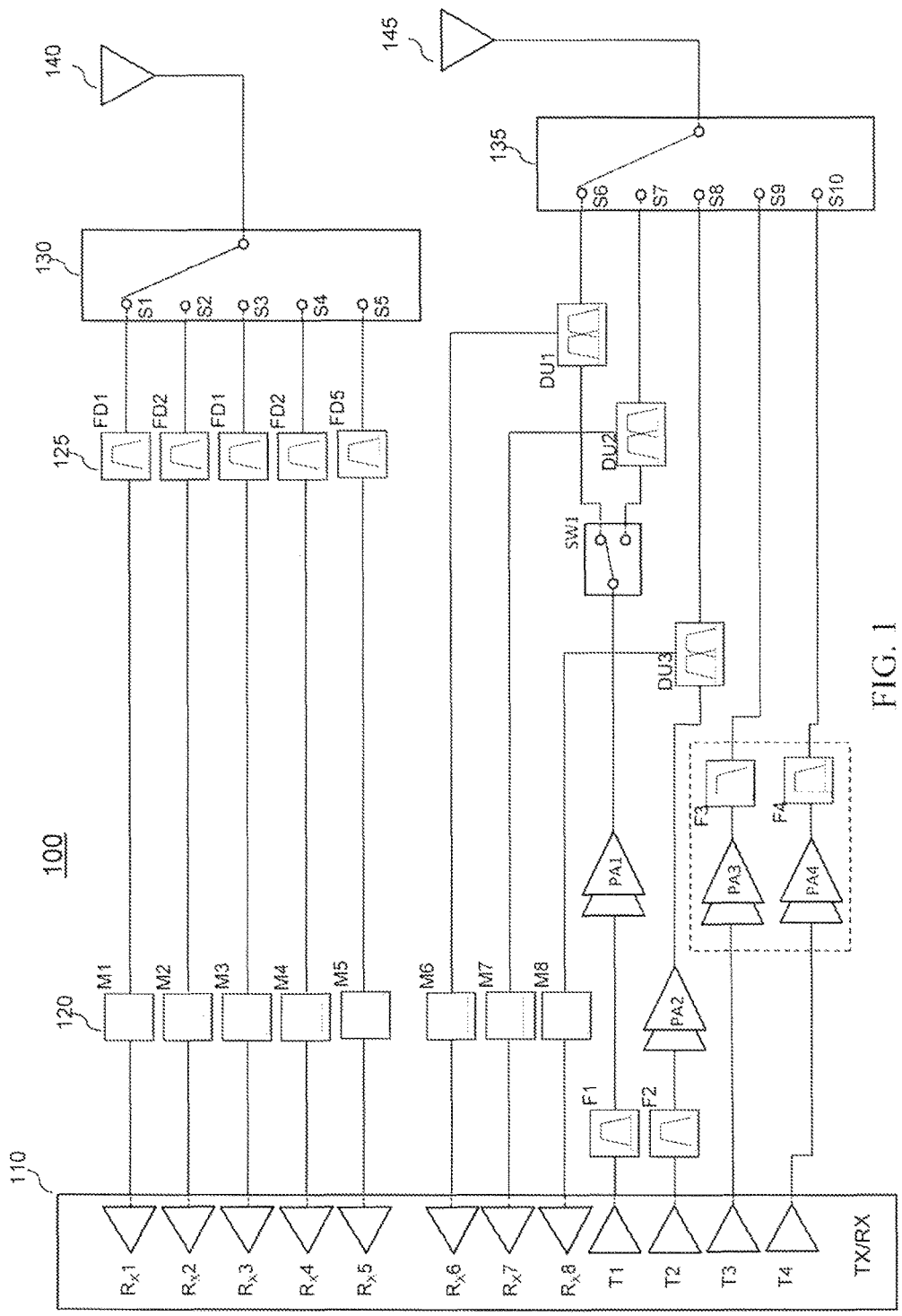
FIG. 1 shows an exemplary block diagram of a multi-band and multi-channel RF front-end stage of an RF device, as used, for example, in a cellular phone. The RF stage comprises transmit and receive paths for high frequency bands and low frequency bands via a main antenna, and receive paths for high frequency bands using a diversity antenna.

Throughout this description, embodiments and variations are described for the purpose of illustrating uses and implementations of the inventive concept. The illustrative description should be understood as presenting examples of the inventive concept, rather than as limiting the scope of the concept as disclosed herein.

As used in the present disclosure, the terms "switch ON" and "activate" may be used interchangeably and can refer to making as particular circuit element electronically operational. As used in the present disclosure. the terms "switch OFF" and "deactivate" may be used interchangeably and can refer to making a particular circuit element electronically non-operational. As used in the present disclosure, the terms "amplifier" and "power amplifier" may be used interchangeably and can refer to a device that is configured to amplify a signal input to the device to produce an output signal of greater magnitude than the magnitude of the input signal.

The present disclosure describes electrical circuits in electronics devices (e.g., cell phones, radios) having a plurality of devices, such as for example, transistors (e.g., MOSFETs). Persons skilled in the art will appreciate that such electrical circuits comprising transistors can be arranged as amplifiers. As described in a previous disclosure (U.S. patent application Ser. No. 13/797,779), a plurality of such amplifiers can be arranged in a so-called "scalable periphery" (SP) architecture of amplifiers where a total number (e.g., 64) of amplifier segments are provided. Depending on the specific requirements of an application, the number of active devices (e.g., 64, 32, etc.), or a portion of the total number of amplifiers (e.g. 1/64, 2/64, 40% of 64, etc . . . ), can be changed for each application. For example, in some instances, the electronic device may desire to output a certain amount of power, which in turn, may require 32 of 64 SP amplifier segments to be used. In yet another application of the electronic device, a lower amount of output power may be desired. in which case, for example, only 16 of 64 SP amplifier segments are used. According to some embodiments, the number of amplifier segments used can be inferred by a nominal desired output power as a function of the maximum output power (e.g. when all the segments are activated). For example, if 30% of the maximum output power is desired, then a portion of the total amplifier segments corresponding to 30% of the total number of segments can be enabled. The sealable periphery amplifier devices can be connected to corresponding impedance matching circuits. The number of amplifier segments of the scalable periphery amplifier device that are turned on or turned off at a given moment can be according to a modulation applied to an input RF signal, a desired output power, a desired linearity requirement of the amplifier or any number of other requirements.

The term "amplifier" as used in the present disclosure is intended to refer to amplifiers comprising single or stacked transistors configured as amplifiers, and can be used interchangeably with the term "power amplifier (PA)". Such terms can refer to a device that is configured to amplify a signal input to the device to produce an output signal of greater magnitude than the magnitude of the input signal. Stacked transistor amplifiers are described for example in U.S. patent application Ser. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e. g., pre-driver, driver, final), known to those skilled in the art.

As used in the present disclosure, the term "mode" can refer to a wireless standard and its attendant modulation and coding, scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA). Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the terms "channel" and "band" are used interchangeably and can refer to a frequency range. More in particular, the terms "channel" and "band" as used herein refers to a frequency range that can be defined by a wireless standard such as, but not limited to, wideband code division multiple access (WCDMA) and long term evolution (LTE).

A more integrated RF front-end where one or more components are adjustable can be reduced in size and complexity compared to a discrete RF front-end with multiple elements that can be switched between in order to accommodate different modes and different bands. One component that can enable such integration in a transmit path of an RF front-end is an amplifier that can be dynamically adjusted during operation of a cellular phone or wireless device that comprises the adjustable amplifier. An RF front-end comprising such an adjustable amplifier could not need to switch between multiple fixed amplifiers (e.g. as in many RF front-ends currently available), but could rather use a smaller number of (or even one of) the adjustable amplifiers to achieve desired performance characteristics (e.g. linearity, data throughput, multimode multiband operation, and so on) of the various transmit paths of the RF front-end. A scalable periphery tunable matching amplifier (SPTM) amplifier can serve as an adjustable amplifier. An SPTM amplifier can he adjusted during operation for different output power levels and other characteristics (e.g. different output impedances, different frequencies of operation, and so forth). Additionally, an SPTM can be adjusted to compensate for manufacturing production tolerances of related components, such as to provide uniform performance across all production samples. An SPTM amplifier can comprise a scalable periphery amplifier whose output is connected to a tunable impedance matching network.

For the case of the receive paths (e.g. reception channel) of an RF front-end stage where active RF amplifiers are not typically used, except ones in a transceiver units of the RF front-end stage, other partitioning of function can be made such as to provide for a better integration, reduced size and complexity of the RF front-end stage. In particular, the present teachings disclose novel partitioning of the reception channel in order to simplify matching circuits associated low noise amplifiers (LNA) at the input of the transceiver IC such as to reduce the number of necessary dedicated LNA inputs to the transceiver IC. This in turn can allow for as smaller footprint of the transceiver IC by virtue of simpler internal circuitry and reduced number of input pins.

FIG. 1 shows a block diagram of an RF front-end stage (100) which can be used for RF transmission and reception of multiple modes and multiple frequency bands signals via as main antenna (145). In the RF front-end stage (100) of FIG. 1, a plurality of transmit and receive paths are used to transmit and receive the RF signals of the multiple modes and multiple frequency bands via the main antenna (145). A main antenna switch (135) is used to switch an RF signal to be transmitted by a transmit path to the antenna, or to switch a received RF signal by the antenna (145) to a receive path for further processing by a transceiver unit (110). In a receive mode, a received RF signal by the antenna (145) can be passed through the main antenna switch (135) which connects the main antenna to one of the plurality of transmit/receive paths, a duplexer unit (DU1-DU3) which can reject frequency bands outside a desired frequency band (e.g. reject a transmit signal band), and then fed to the transceiver unit (110) for further processing. An input component of the transceiver unit (110) for a receive path can comprise a low noise amplifier (LNA) ($R_x6$-$R_x7$) designed to amplify a received RF signal in as specified receive frequency band. A matching network (M6-M7) can he used to match the input stage of the LNA to a source impedance associated to the input receive path and under consideration of the properties of the printed circuit board on which the transceiver IC (110) is assembled. Once the received signal is amplified, the transceiver unit (110) can further down convert the received amplified signal to an intermediate frequency (IF) signal used tar decoding of the information (e.g. voice, data) in the received RF signal.

Coexisting with the main antenna (145), one or more diversity antennas can be used for diversity reception. Because the power level of a received RF signal ran vary significantly with respect to small changes in a position of an antenna, such diversity antennas can he used to reduce the effects of fading of a received RF signal by detecting the signal at different physical points corresponding to the location of the diversity antennas and using the signal with the a higher (e.g. stronger) reception characteristic for further processing and extracting of the information. The person skilled in the art readily knows the concept behind usage and implementation of diversity reception, wherein one or more antennas can be used to detect a same RF signals at two distant points or at a same point but receiving different signal polarization.

In addition to the plurality of transmit/receive paths of FIG. 1 coupled to the main antenna (145) of the RF front-end stage (100), FIG. 1 also shows a plurality of receive paths used for diversity reception via the diversity antenna (140). Similarly, the receive paths for diversity reception can be coupled to the diversity antenna (140) via a diversity antenna switch (130). Each receive path can he tuned for reception of a different mode/band signal via a dedicated filter (125). such as a band-pass filter (FD1-FD5) and an associated LNA amplifier of the transceiver IC can be matched via a dedicated matching network (120) (M1-M5). Although not shown in the block diagram of FIG. 1, various control signals are used to control the operation of the various switches and configurable elements of the RF front-end stage (100). Such control signals can be generated via the transceiver IC (110) or other signal-aware processor of an RF device into which the RF front-end stage (100) is integrated.

Figure 2:
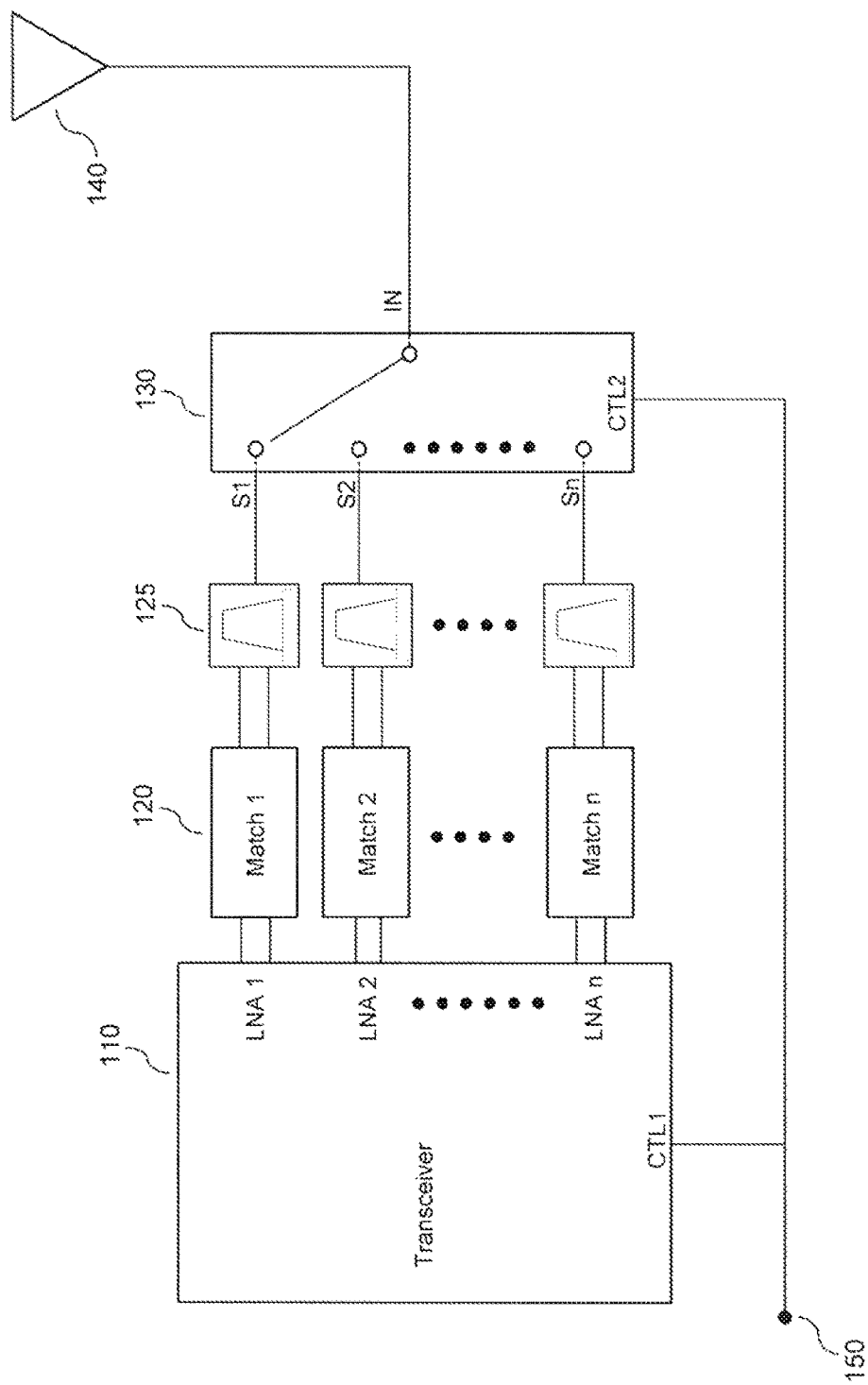
FIG. 2 shows a prior art receive stage of the RF stage of FIG. 1 associated to the diversity antenna, the prior art receive stage comprising a plurality of receive paths switched in/out to the diversity is antenna via an antenna switch, wherein each receive path connects to a dedicated differential input amplifier of a transceiver IC.

Referring to FIG. 2, a prior art multi-band (e.g. n bands, each with a different operating frequency $f_o$) communication system configuration is shown, wherein an input signal (IN) is received by the antenna (140). Such communication system can be the diversity reception system of FIG. 1 discussed in the prior sections of the present disclosure. In the configuration depicted by FIG. 2. parallel reception channels are provided each being tuned to the specific frequency band. A switch (130) placed at the front end side of the reception receives the input signal (IN) from an antenna (140) and routes the signal to one of the plurality of tuned reception channels under control of a control signal (CTL2) fed to the switch. Latter control is derived from a control signal applied to terminal (150) of the system and may be generated by a controller aware of the specific channel band of the input signal (IN). The output (S1-Sn) of the switch (130) is routed to a corresponding filter (125), such as a band-pass filter, specifically tuned to the frequency band of the input signal and configured to transform the single ended input signal (S1-Sn) to a differential output signal fed to a next matching network (120) of the receive path. The matching network (120) is associated to an input LNA (LNA1-LNAn) of the transceiver IC (110) and can be used to improve signal integrity as received by the LNA. As previously mentioned, to achieve optimum performance in receiving the data (e.g. reception channel), the LNA input needs to be matched to the source impedance tinder consideration of the properties of the printed circuit board on which the transceiver IC is assembled. This matching is typically done via matching circuits (e.g. RLC networks) placed. between the input source (e.g. signal) and the LNA input of the transceiver IC (110) and designed to have at relatively narrow passband corresponding to a frequency band of interest (e.g. center frequency $f_0$ of the band).

A control signal (CTL1) fed to the transceiver IC (110) may be used to further configure the transceiver IC (110) to activate a corresponding (LNA1-LNAn) input to which the input signal is routed. Latter control signal may be generated via same controller generating CTL2 for the switch (130). as the configuration control of the transceiver IC (110) and the switch position of the switch (130) may be in synch.

A shortcoming of the RF system depicted in FIG. 2 is the number of dedicated LNA inputs to the transceiver IC, which limits expandability of the configuration as well as size of the IC itself and potentially form factor of the device within which the IC is used.

Figure 3:
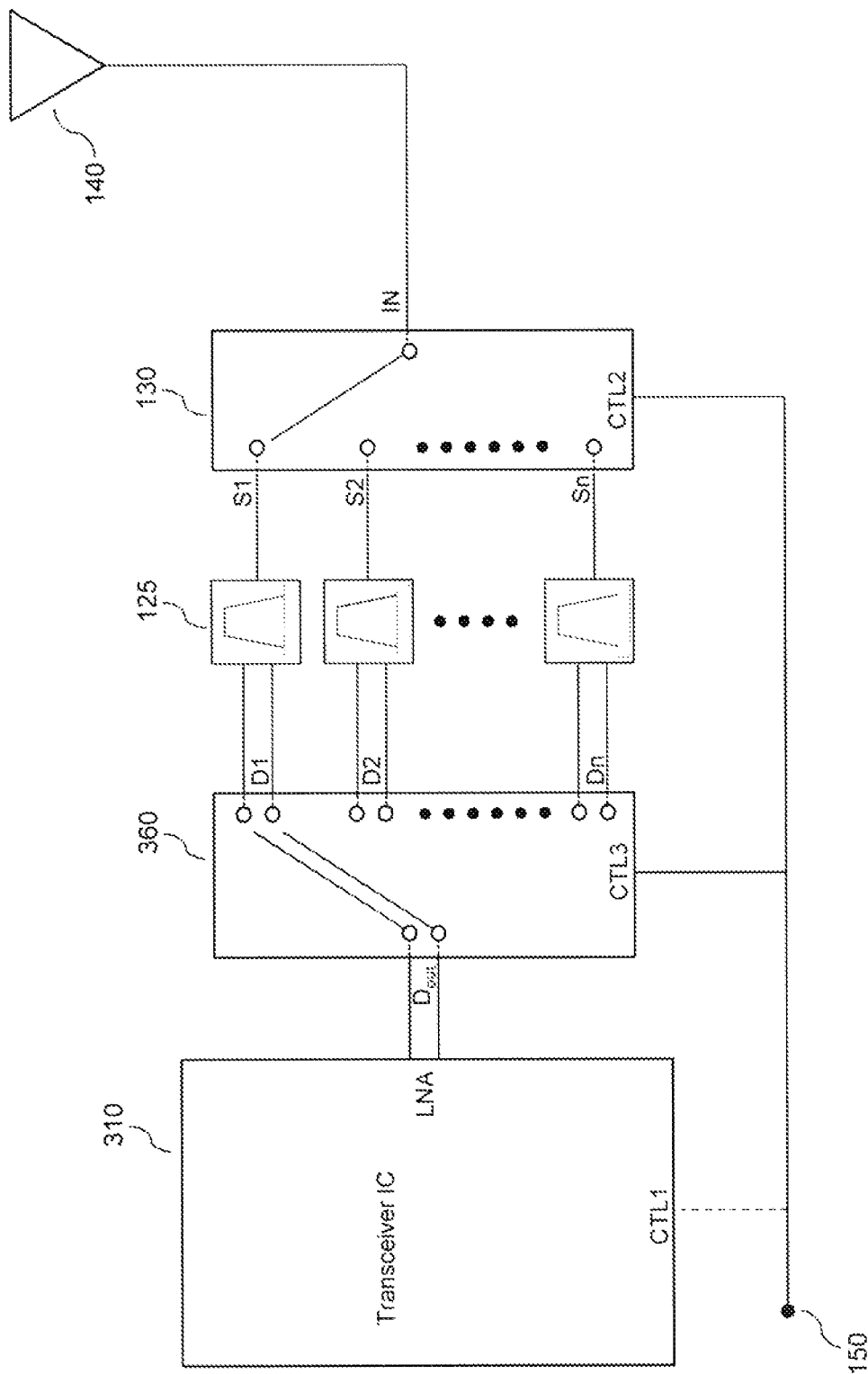
FIG. 3 shows an embodiment according to the present disclosure of a receive stage comprising a plurality of receive paths sharing a single differential input amplifier of the transceiver IC via a transceiver receive switch.

In order to address said shortcoming, an exemplary embodiment according to the present disclosure is shown FIG. 3, wherein the number of dedicated LNA inputs to the transceiver IC (310) are reduced to one. In the embodiment of the FIG. 3, a switch (360) is used to select and route one of the differential outputs (D1-Dn) of the filter elements (125) to the LNA input of the transceiver IC (310). As depicted by FIG. 3, the switch (360) is used to select one of the differential outputs (D1-Dn) of the filter elements (125) connected to its switching terminals (e.g. differential pair terminals), and to route a selected differential output (Dout) at its common terminal to the transceiver IC (310). Also, a switch control signal (CTL3) may be provided to control the setting of the switch (360) in agreement with the setting of the switch (130). Since only one input is provided to the transceiver IC (210), configuration control signal (CTL1) may not be needed in the exemplary embodiment of FIG. 2 and therefore a corresponding control pin to the IC (210) may be eliminated.

Although the exemplary embodiment depicted by FIG. 3 shows one LNA input to the transceiver IC (310), such limitation is merely exemplary in nature and should not he considered as limiting the scope of the invention as per the teachings of the present disclosure. The person skilled in the art can readily apply such teachings to create variants of the exemplary embodiment according to the present disclosure depicted in FIG. 3, such as, for example, configurations wherein a plurality of LNA inputs to the transceiver IC (310) are used, each being coupled to a circuit similar to one depicted in FIG. 3 and having a dedicated antenna. In another exemplary embodiment, one antenna can be used to feed a detected RF signal to a plurality of LNA inputs of the transceiver unit (310) via a plurality of antenna switches (130) feeding a plurality of filters (125) which are coupled w the plurality of IN A inputs via a plurality of switches (360).

Figure 4:
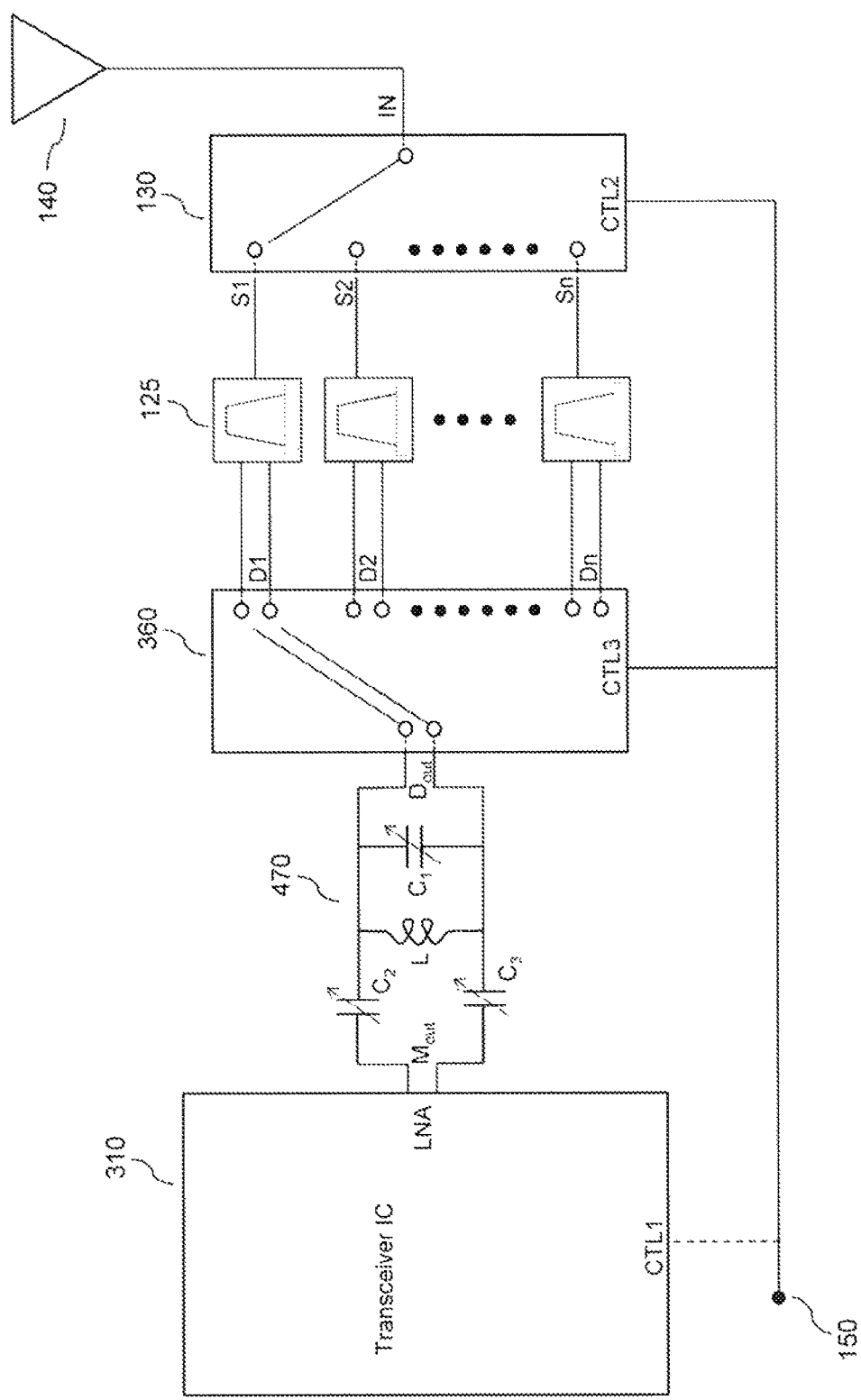
FIG. 4 shows an embodiment according to the present disclosure of a receive stage comprising a plurality of receive paths sharing, a single differential input amplifier of the transceiver IC, wherein the differential input amplifier can be tuned for each receive path via a tunable matching network.

The person skilled in the art will readily notice that the embodiment according to the present disclosure depicted in FIG. 3 does not comprise a matching network to the input stage of the LNA. Since the RF signal received and routed through the circuit of FIG. 3 contains relatively high frequency components, printed circuit board. characteristic within which the circuit is laid out and assembled may influence the RF signal and produce a suboptimal signal at the LNA input of the transceiver IC (310). In order to address this issue, an embodiment according to the present disclosure is shown in FIG. 4, wherein a further tuning, circuit (470) (e.g. impedance matching) is provided between the LNA input of the transceiver IC (310) and the output of the switch (360), By virtue of its tuning elements (e.g. variable capacitors $C_1$-$C_3$) which allow to tune an impedance of the tuning circuit (470), the tuning circuit (470) of FIG. 1 allows to fine tune the input RF to the transceiver IC (310) and therefore enhance RF signal characteristics at the LNA input. Such enhancement can be obtained by improving the impedance match between the input stage of the LNA and the receive path which in turn can, for example, reduce RF signal loss to the LNA unit, maintain a frequency content of the RF signal and reduce noise at the input stage of the LNA (e.g. reduced noise figure).

Although the tuning circuit (470) of FIG. 4 comprises only tunable capacitors (e.g. C1-C3). the person skilled in the art readily knows how to realize other tuning circuits (e.g. filters) comprising any combination of one or more tunable reactive elements, such as capacitors and inductors. for the intended use of the embodiment depicted in FIG. 4. Such reactive elements can be digitally tunable capacitors and/or digitally tunable inductors as described, for example, in the referenced international Application No. PCT/US2009/001358 and in the referenced U.S. patent application Ser. No. 13/595,893. Some examples of tuning circuits are also provided in, for example, the referenced U.S. patent application Ser. No. 14/042312 and the referenced U.S. patent application Ser. No. 13/967,866. The person skilled in the art may also find implementation instances wherein the tuning circuit can use resistive elements, such as variable resistors.

Figure 5:
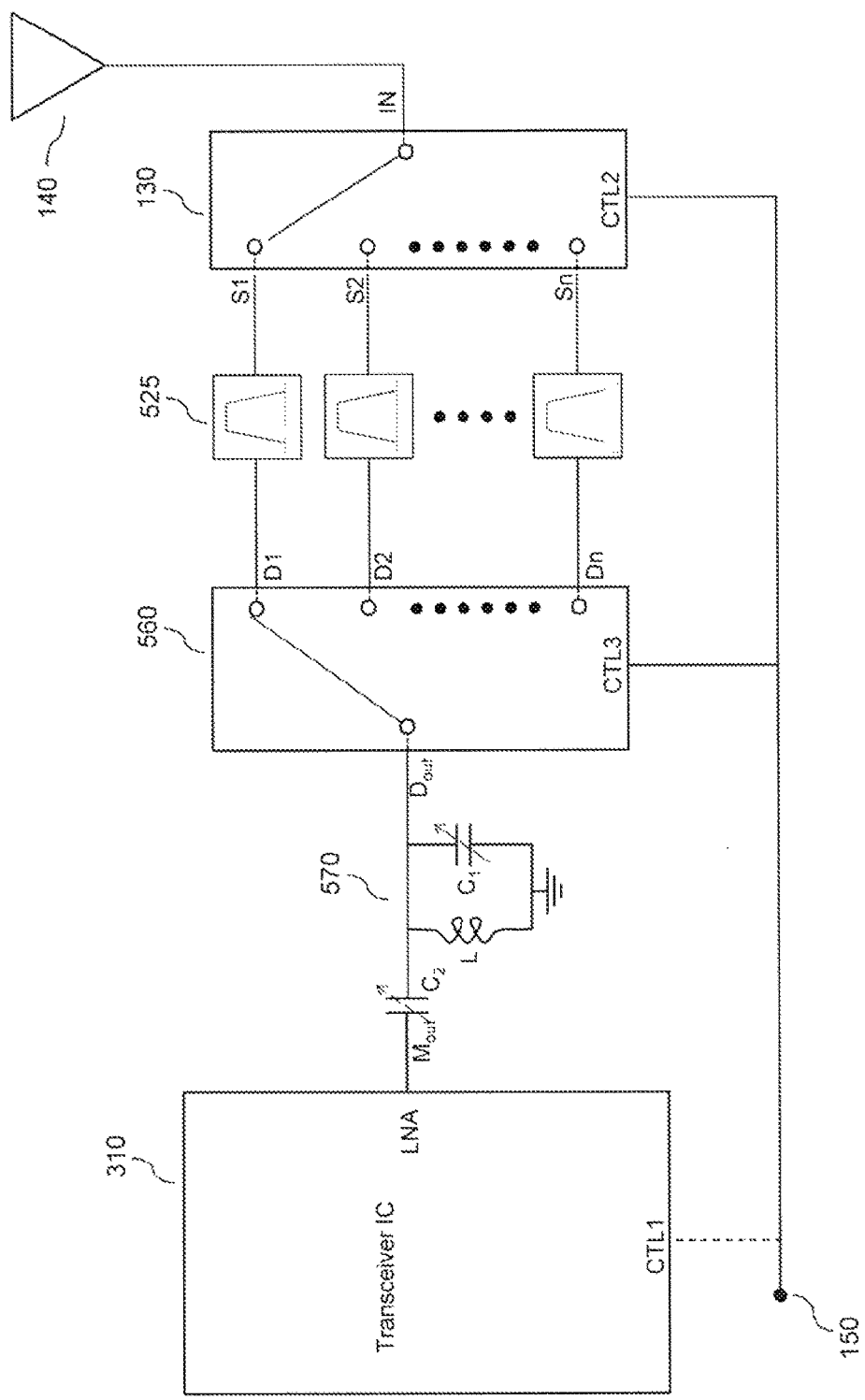
FIG. 5 shows a single ended configuration of the embodiment according to the present disclosure depicted in FIG. 4.

For reasons well known to the person skilled in the art, such as for example, improved immunity of as low level signal to a system ground noise, a differential signal implementation for routing of the RF signal in a receive path may be desired. Such configuration is shown in FIGS. 2-4, wherein a first filter element (125) in the receive path after the antenna switch (130) is adapted to transform a single-ended RF signal to a differential RF signal and therefore decouple the RF signal from ground system of the circuit from that point on. In the embodiments depicted by FIGS. 2-4, the differential signal routing is maintained to the input LNA of the transceiver unit (110, 310). Although a differential routing may have some benefits, such routing is not necessary for the teachings of the present disclosure. It follows that according to yet another embodiment of the present disclosure, a single-ended configuration of the configurations presented in FIGS. 3-4 is presented, such as, for example, as depicted in FIG. 5. The single-ended communication system presented in FIG. 5 is the dual of the differential communication system presented in FIG. 4. The person skilled in the art will need no further explanation of the transformation performed to the differential configuration of FIG. 4 to obtain the single-ended configuration of FIG. 5.

Figure 6:
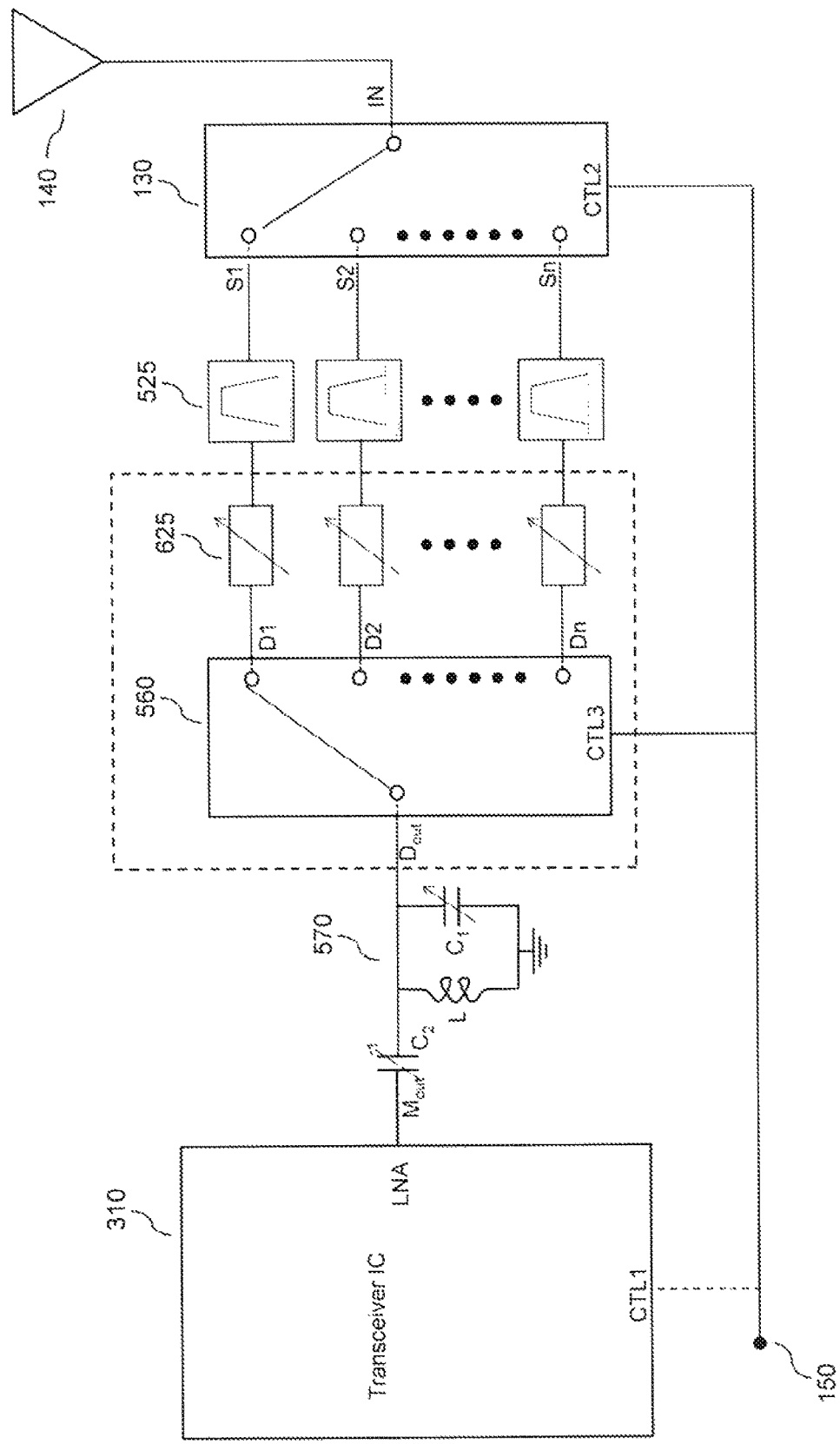
FIG. 6 shows an embodiment according to the present disclosure similar to the embodiments depicted in FIGS. 4-5, wherein further tuning elements are included in the receive paths prior to the transceiver receive switch.

Although the exemplary embodiments according to the present disclosure depicted in FIGS. 4 and 5 show as straight connection path between filter elements (125) and the RF switch (360, 560), according to a further embodiment of the present disclosure, such connection path can comprise further tuning circuits, as depicted in FIG. 6. Such tuning circuits (625) of FIG. 6 can be placed prior to the transceiver switch (560, 360) and after the filters (525, 325). Although such configuration (e.g. FIG. 6) can result in more complexity of the corresponding circuital arrangement, the added tunability can provide other benefits, such as, for example, improving the tuning range of an associated receive path, such as to provide for enhanced signal characteristics of an RF signal conducted through such receive path, or even to provide support for a larger number of channel frequencies received through the same receive path. According to further embodiments of the present disclosure, such tuning circuits (625) can be monolithically integrated within a same integrated circuit comprising the transceiver switch (360, 560) as indicated by the dotted box around component (560, 625) of FIG. 6. Such integration can provide benefits such as improved noise immunity, improved signal integrity, improve tuning resolution and other benefits well known to the person skilled in the art. Examples of tunable networks which can be used as the tuning circuits (625) can be found, for example, in the referenced U.S. patent application Ser. No. 13/967,866 and U.S. patent application Ser. No. 13/797,686. Such tuning circuits can comprise variable reactive elements (e.g. variable capacitors/inductors, DTCs, DTLs, . . . ) as well as other components used by the skilled person to tune transmission lines used in RF circuits.

Figure 7:
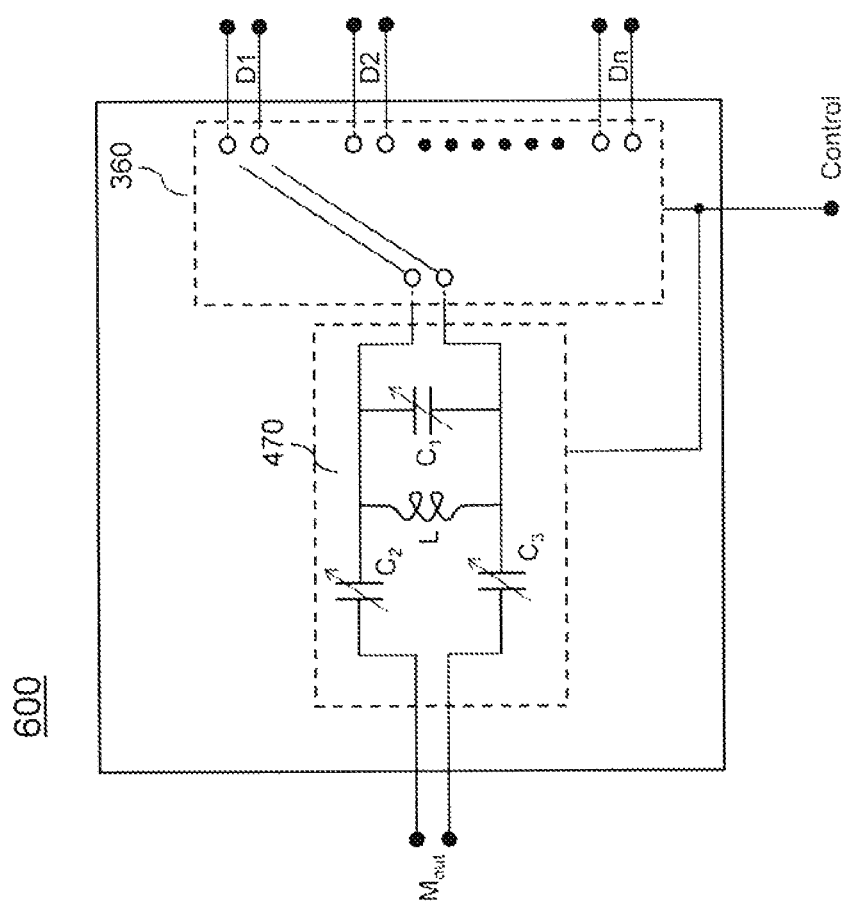
FIG. 7 shows an embodiment according to the present disclosure of an RF switch with integrated tuning.

As described in the prior sections, the various teachings according to the present disclosure allow for a simplified receive path communication system by reducing the number of necessary LNA units in a transceiver unit of the communication system. This reduction in number of necessary LNA units is mainly obtained by using a switch to multiplex an RF signal from a plurality of receive paths to an LNA input of the transceiver unit. In some cases, the switch can be followed by a tuning network for enhancing some characteristics of the RF signal reception at the input of the LNA unit. It follows, that according to an embodiment of the present disclosure an RF switch with integrated timing is presented, as depicted by the integrated circuit (600) of FIG. 7. The integrated circuit (600) depicted in FIG. 7 can be monolithically integrated and comprises the RF switch (360) and the tuning circuit (470). Although the exemplary embodiment according to the present disclosure as depicted in FIG. 7 shows an integrated differential configuration of the RF switch with integrated tuning, as previously discussed an integrated single ended configuration is also possible. A control terminal (Control) of the integrated circuit (600) can be used by a controller module Of the communication system to control the setting of the switch element (360) and the tuning element 470). Such control terminal may be adapted to receive one or more control signals as dictated by a desired interface. The person skilled in the art will find numerous was to implement such interface using techniques and/or design samples well known in the art.

Figure 8:
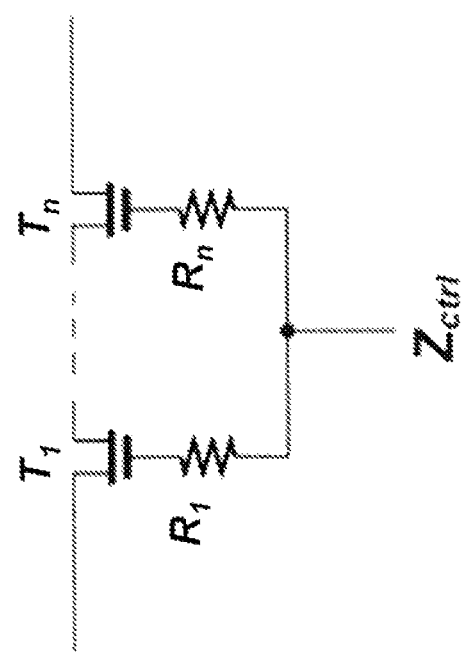
FIG. 8 shows an exemplary embodiment according to the present disclosure of a switch with stacked transistors.

By way of further example and not limitation, any switch or switching circuitry of the present disclosure, such as switches (130, 135, 360 and 560) shown in the various figures of the present disclosure can be implemented using transistors, stacked transistors (FETs), diodes, or any other devices or techniques known to or which can be envisioned by as person skilled in the art. In particular, such switching circuitry can be constructed using CMOS technology and various architectures known to the skilled person, such as, for example, architecture presented in U.S. Pat. No. 7,910, 993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both incorporated herein by reference in their entirety. FIG. 8 shows an exemplary embodiment of a single-pole single-throw switch with stacked transistors, which the skilled person can use as an elementary component of die various switches used in the various embodiments according to the present disclosure.

Although FETs (e.g. MOSFETs) can be used to describe transistor and stacked transistor switches used in the various embodiments of the present disclosure, a person skilled in the art would recognize that either P-type or N-type MOSFET's may be used. The skilled person would also recognize that other types of transistors such as, for example, bipolar junction transistors (BJTs) can be used instead or in combination with the N-type or P-type MOSFETs. Furthermore, a person skilled in the art will also appreciate the advantage of stacking more than two transistors, such as three, four, five or more, provide on the voltage handling performance of the switch. This can for example he achieved when using non bulk-Silicon technology, such as insulated Silicon on Sapphire (SOS) technology and silicon on insulated (SOI) technology. In general, the various switches used in the various embodiments of the present disclosure, including when monolithically integrated with the RF tuning circuit, such as depicted in (600) of FIG. 7, can be constructed using CMOS, silicon germanium (SiGe), gallium arsenide (GaAs), gallium nitride (GaN), bipolar transistors, or any other viable semiconductor technology and architecture known, including micro-electro-mechanical (MEM) systems. Additionally, different device sizes and types can be used within a stacked transistor switch such as to accommodate various current handling capabilities of the switch.

Figure 9:
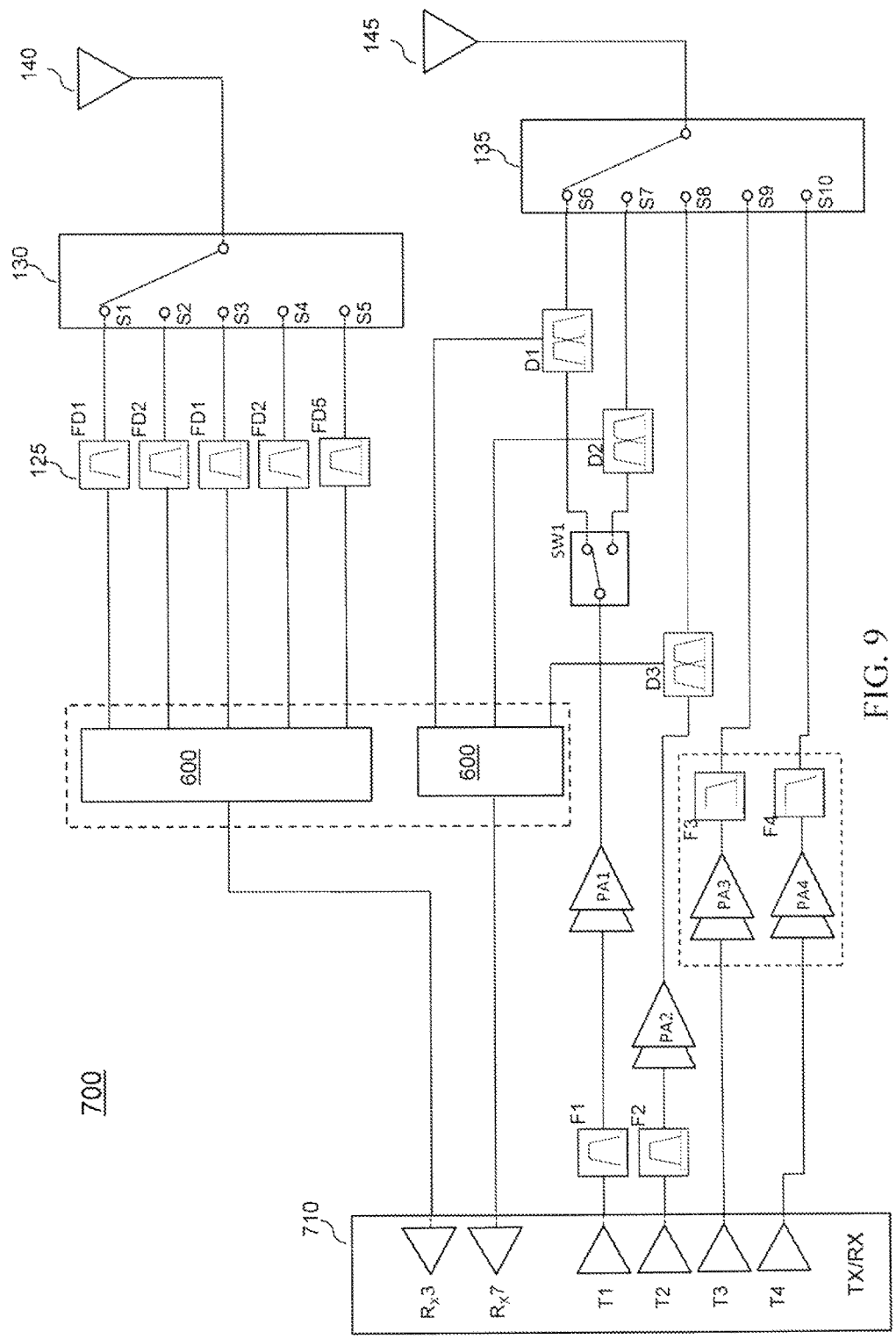
FIG. 9 shows a simplified version of the exemplary block diagram of a multi-band and multi-channel RF front-end stage of FIG. 1, wherein simplification is obtained via usage of the RF switch with integrated tuning of FIG. 7.

According to an embodiment of the present disclosure, a simplified version of the exemplary block diagram of a multi-band and multi-channel RF front-end stage of FIG. 1 is presented in FIG. 9. In the embodiment depicted by FIG. 9, simplification in routing and reduction in number of elements of the various receive paths from either the main antenna (145) or the diversity antenna (140) is obtained by using the RF switch with integrated tuning (600) while keeping the same functionality (number of channels/paths being processed by the transceiver unit) as in the configuration of FIG. 1. Although the exemplary configuration of the front-end stage (700) of FIG. 9 uses two components (600), one in the receive paths of the main antenna (145) and the other in the receive paths of the diversity antenna (140), the person skilled in the art will know that this is a mere exemplary embodiment and other embodiments are possible using the teachings of the present disclosure. For example, in one exemplary embodiment, the two components (300) can be further integrated into one as indicated by the dashed lines around these two components in FIG. 9. To be also noted that such simplification in routing and reduced number of components can in turn favorably affect signal integrity in the RF front-end stage (700) of FIG. 9, obtained for example by increasing distance between various traces in the circuital layout of the RF front-end stage (700) and thus reducing signal crosstalk. Furthermore, the embodiment according to the present disclosure and as depicted in FIG. 9 can allow a reduction in number of LNA inputs to the transceiver unit (710) and thus allow for a more compact and simplified transceiver unit and a reduced form factor of the front-end stage (700).

The examples set forth above are provided to give those of ordinary skill in the an a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing, from the spirit and scope of the present disclosure. Accordingly, other embodiments are within the scope of the following claims.

The invention claimed is:

1. A radio frequency (RF) circuital arrangement configured to receive an RF signal at an input RF receive port of the RF circuital arrangement and provide a tuned version of the RF signal at a transceiver RF receive port, comprising:
   an RF transceiver switch comprising a common terminal and a plurality of switching terminals,
   an RF tuning circuit coupled to the common terminal of the RF transceiver switch via a first terminal of the RF tuning circuit,
   a plurality of RF receive paths connected to the plurality of switching terminals of the RF transceiver switch, wherein the plurality of RF receive paths are coupled to the input RF receive port via an RF receive switch, and wherein during operation of the RF circuital arrangement, the RF receive switch is configured to selectively route the RF signal at the input RF receive port to an RF receive path of the plurality of RF receive paths, and one or more filters in correspondence of a plurality of modes with different modulation schemes and bands of operation of the RF circuital arrangement,
   wherein, during operation of the RF circuital arrangement:
   the RF transceiver switch is configured to selectively couple an RF signal at a switching terminal of the plurality of switching terminals to the first terminal of the RF tuning circuit, and
   the RF tuning circuit is configured to tune a characteristic of the RF signal at the first terminal of the RF tuning circuit based on the selected switching terminal and provide a tuned version of the RF signal at a second terminal of the RF tuning circuit coupled to the transceiver RF receive port,
   wherein:
   a conduction path of the RF signal between the input RF receive port and the transceiver RF receive port consists of a combination of reactive and resistive conduction paths and is devoid of an active device so as to maintain a frequency content of the RF signal,
   the transceiver receive port is an input port of a low noise amplifier of a transceiver unit, the transceiver unit configured to down-convert the tuned version of the RF signal at an output of the low noise amplifier, and
   the plurality of RF receive paths are in correspondence of the plurality of modes with different modulation schemes and bands of operation of the RF circuital arrangement.

2. The RF circuital arrangement of claim 1, wherein the conduction path of the RF signal between the input RF receive port and the transceiver RF receive port is devoid of a signal amplification element.

3. The RF circuital arrangement of claim 1, wherein a receive path of the plurality of receive paths comprises a filter of the one or more filters.

4. The RF circuital arrangement of claim 3, wherein the filter of the one or more filters is an adjustable filter.

5. The RF circuital arrangement of claim 1, wherein the RF tuning circuit comprises one or more variable reactive elements.

6. The RF circuital arrangement of claim 5, wherein the one or more variable reactive elements are configured, during operation of the RF circuital arrangement, to tune an impedance of the RF tuning circuit.

7. The RF circuital arrangement of claim 5, wherein a reactive element of the one or more variable reactive elements comprises one of: a) a digitally tunable capacitor, and b) a digitally tunable inductor.

8. The RF circuital arrangement of claim 5, wherein the RF tuning circuit further comprises a resistive element.

9. The RF circuital arrangement of claim 1, wherein the RF tuning circuit and the RF transceiver switch are monolithically integrated on a same integrated circuit.

10. The RF circuital arrangement of claim 9, wherein the monolithically integrated RF tuning circuit and RF transceiver switch is fabricated using a technology comprising one of: a) Silicon on Sapphire, b) Silicon on Insulator, c) bulk-Silicon, and d) micro-electro-mechanical systems.

11. The RF circuital arrangement of claim 9, wherein the RF tuning circuit and the RF transceiver switch are configured for operation in one of: a) a differential mode, and b) single-ended mode.

12. The RF circuital arrangement of claim 1, wherein a characteristic of the RF signal comprises one or more of: a) a noise component of the RF signal, b) a power loss of the RF signal, c) a frequency content of the RF signal, and d) a characteristic impedance of an RF conduction path in correspondence of the RF signal.

13. A communication device for receiving an RF signal, the communication device comprising:
the RF circuital arrangement of claim 1, and
an antenna coupled to the input RF receive port of the RF circuital arrangement.

14. The communication device of claim 13 further comprising a transceiver unit, wherein an input to the transceiver unit is provided by the transceiver RF receive port coupled to the second terminal of the RF tuning circuit.

15. The communication device of claim 13, wherein during operation of the communication device, the RF tuning circuit is configured to match an input impedance at the input to the transceiver unit to a characteristic impedance of an RF receive path in correspondence of the RF signal.

16. A radio frequency (RF) integrated circuit comprising:
an RF switch comprising a common terminal and a plurality of switch terminals;
an RF tuning circuit comprising a first port and a second port, wherein the first port is connected to the common terminal of the RF switch;
a plurality of RF receive paths connecting a plurality of input terminals to the plurality of switch terminals;
one or more filters in correspondence of a plurality of modes with different modulation schemes and bands of operation of the RF integrated circuit;
an output terminal connected to the second port of the RF tuning circuit; and
one or more control terminals,
wherein:
during operation, a control signal at a terminal of the one or more control terminals of the RF integrated circuit is configured to tune the tuning circuit and/or connect one terminal of the plurality of switch terminals to the common terminal of the RF switch,
a conduction path between any input terminal of the plurality of input terminals and the output terminal consists of a combination of reactive and resistive conduction paths and is devoid of a signal amplification element so as to maintain a frequency content of an RF signal provided to the any input terminal at the output terminal, and
the plurality of RF receive paths are in correspondence of the plurality of modes with different modulation schemes and bands of operation of the RF integrated circuit.

17. The RF integrated circuit of claim 16, wherein during operation, an impedance of the RF tuning circuit is configured to be tuned.

18. The RF integrated circuit of claim 17, wherein the RF tuning circuit comprises one or more variable reactive elements.

19. The RF integrated circuit of claim 18, wherein a reactive element of the one or more variable reactive elements comprises one of: a) a digitally tunable capacitor, and b) a digitally tunable inductor.

20. The RF integrated circuit of claim 18, wherein the RF tuning circuit further comprises a resistive element.

21. The RF integrated circuit of claim 18 monolithically integrated on a same integrated circuit.

22. The RF integrated circuit of claim 21 fabricated using a technology comprising one of: a) Silicon on Sapphire, b) Silicon on Insulator, c) bulk-Silicon, and d) micro-electro-mechanical systems.

23. The RF integrated circuit of claim 17 configured for operation in one of: a) a differential mode, and b) single-ended mode.

24. A method for operating a radio frequency (RF) integrated circuit, the method comprising:
selectively coupling a plurality of RF receive paths to one input amplifier of an RF transceiver unit via the RF integrated circuit of claim 16; and
based on the selective coupling, processing via the RF transceiver unit, a plurality of RF signals in correspondence of the plurality of RF receive paths.

25. The method of claim 24, further comprising:
providing a control signal to the RF integrated circuit;
based on the providing, coupling an RF receive path of the plurality of RF receive paths to the input amplifier of the RF transceiver unit; and
based on the providing, varying an impedance of the tuning circuit according to a characteristics of the coupled RF receive path.

26. The method of claim 25, wherein the characteristics of the coupled RF path comprises one or more of: a) a characteristic impedance of the coupled RF path, and b) a frequency content/band associated to the coupled RF path.

27. The method of claim 25 wherein the control signal comprises one or more control signals provided by the RF transceiver unit.

28. A method for reducing complexity of a radio frequency (RF) circuital arrangement, the method comprising:
providing an RF switch comprising a common terminal and a plurality of switching terminals;
providing an RF tuning circuit consisting of one or a combination of: a) a reactive element, and b) a resistive element;
coupling a first terminal of the RF tuning circuit to the common terminal of the RF switch;
selecting, via the RF switch, a receive path of a plurality of receive paths, routing an RF signal to a first switching terminal of the plurality of switching terminals of the RF switch, wherein the plurality of receive paths are in correspondence of modes with different modulation schemes and bands of operation of the RF integrated circuit;
based on the selecting, configuring the RF tuning circuit for a first tuning of a plurality of different tunings,
based on the selecting and the configuring, providing a conduction path to the RF signal consisting of a combination of reactive and resistive conduction paths devoid of an active device between the first switching terminal and a second terminal of the RF tuning circuit,
providing one or more filters in the plurality of receive paths wherein the one or more filters are in correspondence of the modes with the different modulation schemes and the bands of operation of the RF integrated circuit,
and
based on the providing, obtaining a tuned RF signal at the second terminal of the RF tuning circuit having a same frequency content as a frequency content of the RF signal,
inputting the tuned RF signal to a low noise amplifier;
based on the inputting, amplifying the tuned RF signal, and
based on the amplifying, down converting the tuned RF signal to obtain transmitted data in the RF signal.

29. The method of claim 28, further comprising:
selecting via the RF switch, an RF signal at a second switching terminal of the plurality of switching terminals of the RF switch, and
based on the selecting, configuring the RF tuning circuit for a second tuning of the plurality of different tunings, the second tuning being different from the first tuning.

30. The method of claim 28, wherein the plurality of receive paths comprise a plurality of RF paths, the method further comprising:
coupling the plurality of RF paths to a transmit/receive antenna, and
coupling the plurality of RF paths to the plurality of switching terminals,
wherein the selecting, via the RF switch, of the RF signal is in correspondence of selecting, via the RF switch, of an RF path of the plurality of RF paths, the RF path conducting the RF signal during operation.

31. The method of claim 30, wherein the configuring the RF tuning circuit is based on characteristics of the selected RF path.

32. The method of claim 31, wherein the characteristics of the selected RF path comprises one or more of: a) a frequency band of the RF signal, and b) an impedance characteristic of the selected RF path.

33. A radio frequency (RF) circuital arrangement configured to receive an RF signal at an input RF receive port of the RF circuital arrangement and provide a tuned version of the RF signal at a transceiver RF receive port, comprising:
   i) an antenna to receive the RF signal;
   ii) an RF front-end circuit comprising:
      an antenna switch comprising a first common terminal coupled to the antenna and a plurality of antenna switching terminals;
      a transceiver switch comprising a second common terminal and a plurality of transceiver switching terminals coupled to the plurality of antenna switching terminals via a plurality of RF receive paths comprising one or more filters, wherein the one or more filters and the plurality of RF receive paths are in correspondence of a plurality of modes with different modulation schemes and bands of operation of the RF circuital arrangement;
      an RF tuning circuit comprising a first terminal coupled to the second common terminal of the transceiver switch, and a second terminal; and
   iii) a transceiver unit comprising:
      an input low noise amplifier comprising an input port connected to the second terminal of the RF tuning circuit, and an output node; and
      a down-converter connected to the output node of the input low noise amplifier,
wherein, during operation of the RF circuital arrangement:
the antenna switch is configured to selectively couple the RF signal received at the antenna to a switching terminal of plurality of switching terminals of the transceiver switch,
the transceiver switch is configured to selectively couple the RF signal at the switching terminal of the plurality of switching terminals to the first terminal of the RF tuning circuit, and
the RF tuning circuit is configured to tune a characteristic of the RF signal at the first terminal of the RF tuning circuit based on the selected switching terminal and provide a tuned version of the RF signal at a second terminal of the RF tuning circuit connected to the input port of the low noise amplifier,
wherein a frequency content of the input RF signal and a frequency content of the tuned version of the RF signal comprises a same frequency.

* * * * *